United States Patent
Hioka et al.

(10) Patent No.: US 11,016,151 B2
(45) Date of Patent: May 25, 2021

(54) SEMICONDUCTOR DEVICE AND METHOD OF ADJUSTING THE SAME

(71) Applicant: ABLIC Inc., Chiba (JP)

(72) Inventors: Takaaki Hioka, Chiba (JP); Tomoki Hikichi, Chiba (JP)

(73) Assignee: ABLIC INC., Chiba (JP)

( * ) Notice: Subject to any disclaimer, the term of this patent is extended or adjusted under 35 U.S.C. 154(b) by 70 days.

(21) Appl. No.: 16/298,434

(22) Filed: Mar. 11, 2019

(65) Prior Publication Data
US 2019/0285708 A1    Sep. 19, 2019

(30) Foreign Application Priority Data

Mar. 14, 2018 (JP) .............................. JP2018-046888
Dec. 10, 2018 (JP) .............................. JP2018-230554

(51) Int. Cl.
*G01R 33/07* (2006.01)
*H01L 43/06* (2006.01)
*H03K 3/3565* (2006.01)
*H03K 5/24* (2006.01)

(52) U.S. Cl.
CPC ......... *G01R 33/077* (2013.01); *G01R 33/075* (2013.01); *H01L 43/065* (2013.01); *H03K 3/3565* (2013.01); *H03K 5/24* (2013.01)

(58) Field of Classification Search
None
See application file for complete search history.

(56) References Cited

U.S. PATENT DOCUMENTS

| | | | | |
|---|---|---|---|---|
| 2007/0290682 A1* | 12/2007 | Oohira | ................ | G01R 33/075 324/251 |
| 2008/0074106 A1* | 3/2008 | Oohira | ................... | G01R 33/07 324/209 |
| 2010/0117640 A1* | 5/2010 | Sugiura | .................. | G01R 33/07 324/251 |
| 2011/0101975 A1* | 5/2011 | Popovic | ............... | G01R 33/075 324/251 |
| 2012/0286776 A1 | 11/2012 | Ausserlechner et al. | | |

(Continued)

FOREIGN PATENT DOCUMENTS

EP    1 438 755 B1    1/2005

OTHER PUBLICATIONS

Extended European Search Report in Europe Application No. 19162903.9, dated Aug. 5, 2019, 7 pages.

*Primary Examiner* — Nasima Monsur
(74) *Attorney, Agent, or Firm* — Brinks Gilson & Lione

(57) ABSTRACT

The semiconductor device includes a first vertical Hall element provided in a first region of a semiconductor substrate, and including a first plurality of electrodes arranged at predetermined intervals on a first straight line, a second vertical Hall element provided in a second region of the semiconductor substrate different from the first region, and including a second plurality of electrodes of the same number as that of the first plurality of electrodes, the second plurality of electrodes being arranged at the predetermined intervals on a second straight line parallel to the first straight line, a first drive power source configured to drive the first vertical Hall element, and a second drive power source configured to drive the second vertical Hall element and provided separately from the first drive power source.

17 Claims, 6 Drawing Sheets

(56) References Cited

U.S. PATENT DOCUMENTS

2013/0342194 A1 12/2013 Motz et al.
2014/0210461 A1* 7/2014 Ausserlechner ........ H01L 43/04
　　　　　　　　　　　　　　　　　　　　　　324/251
2016/0216296 A1* 7/2016 Nakayama ........... G01R 15/202

* cited by examiner

SEMICONDUCTOR DEVICE AND METHOD OF ADJUSTING THE SAME

RELATED APPLICATIONS

This application claims priority under 35 U.S.C. § 119 to Japanese Patent Application Nos. 2018-046888 filed on Mar. 14, 2018 and 2018-230554 filed on Dec. 10, 2018, the entire content of which is hereby incorporated by reference.

BACKGROUND OF THE INVENTION

1. Field of the Invention

The present invention relates to a semiconductor device and a method of adjusting the semiconductor device, and more particularly, to a semiconductor device including vertical Hall elements each configured to detect a magnetic field in a horizontal direction, and a method of adjusting the semiconductor device.

2. Description of the Related Art

A Hall element is capable of detecting position or angle without contact as a magnetic sensor, and accordingly has various uses. While magnetic sensors that use a horizontal Hall element configured to detect a magnetic field component perpendicular to a semiconductor substrate surface (vertical magnetic field) are particularly well known, there have also been proposed various magnetic sensors that use a vertical Hall element configured to detect a magnetic field component parallel to the semiconductor substrate surface (horizontal magnetic field).

Since it is difficult to give a structure with high geometrical symmetry to a vertical Hall element, the vertical Hall element tends to generate a so-called offset voltage which is provided even at the absence of a magnetic field as compared with the horizontal Hall elements. In the use of the vertical Hall element as a magnetic sensor, the above-mentioned offset voltage should be removed. The spinning current method has been known as a method for removing such offset voltage.

As the method of removing the offset voltage through use of the spinning current method, for example, in European Patent No. 1438755, there is disclosed a method in which, as illustrated in FIG. 6, two (plurality of) vertical Hall elements 300 and 400 having the same structure are arranged in parallel, and electrodes 311 to 315 of the vertical Hall element 300 and electrodes 411 to 415 of the Hall element 400 are connected by wiring lines W1 to W6 as illustrated in FIG. 6, to thereby perform the spinning current method. With the method of European Patent No. 1438755, at the execution of the spinning current method, resistances in current paths are equal in any of phases in which the direction of current is switched, and the accuracy of removal of the offset voltage can be improved.

If the characteristics of the plurality of vertical Hall elements are completely the same, as described above, the resistances along the current paths are equal in any of the phases at the execution of the spinning current method, and hence the offset voltage can be accurately removed.

Although the plurality of vertical Hall elements is formed simultaneously on the same substrate by a semiconductor manufacturing process, it is however extremely difficult to obtain totally the same impurity concentration distribution or the like in the plurality of vertical Hall elements. Accordingly, the plurality of vertical Hall elements has variations in the characteristics. The resistances along the current paths are therefore not totally equal in each phase at the execution of the spinning current method, and accuracy of offset cancellation is thus not improved much.

SUMMARY OF THE INVENTION

It is therefore an object of the present invention to provide a semiconductor device which includes vertical Hall elements and is capable of more accurately achieving offset cancellation by spinning current method.

In one embodiment of the present invention, there is provided a semiconductor device including, a first vertical Hall element provided in a first region of a semiconductor substrate, and including a first plurality of electrodes arranged at predetermined intervals on a first straight line, a second vertical Hall element provided in a second region of the semiconductor substrate which is different from the first region, and including a second plurality of electrodes of the same number as a number of the first plurality of electrodes, the second plurality of electrodes being arranged at the predetermined intervals on a second straight line parallel to the first straight line, a first drive power source configured to drive the first vertical Hall element, and a second drive power source configured to drive the second vertical Hall element and provided separately from the first drive power source.

According to one embodiment of the present invention, the first and second vertical Hall elements are independently driven by separate drive power sources. Thus, errors in characteristics of the first and second vertical Hall elements generated in a semiconductor manufacturing process can be compensated by appropriately adjusting the first and second drive power sources. The spinning current method can therefore be performed under a condition in which characteristics of the first and second vertical Hall elements are set substantially the same, and hence offset cancellation can be achieved with high accuracy.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENTS

The invention will now be described herein with reference to illustrative embodiments.

Figure 1:
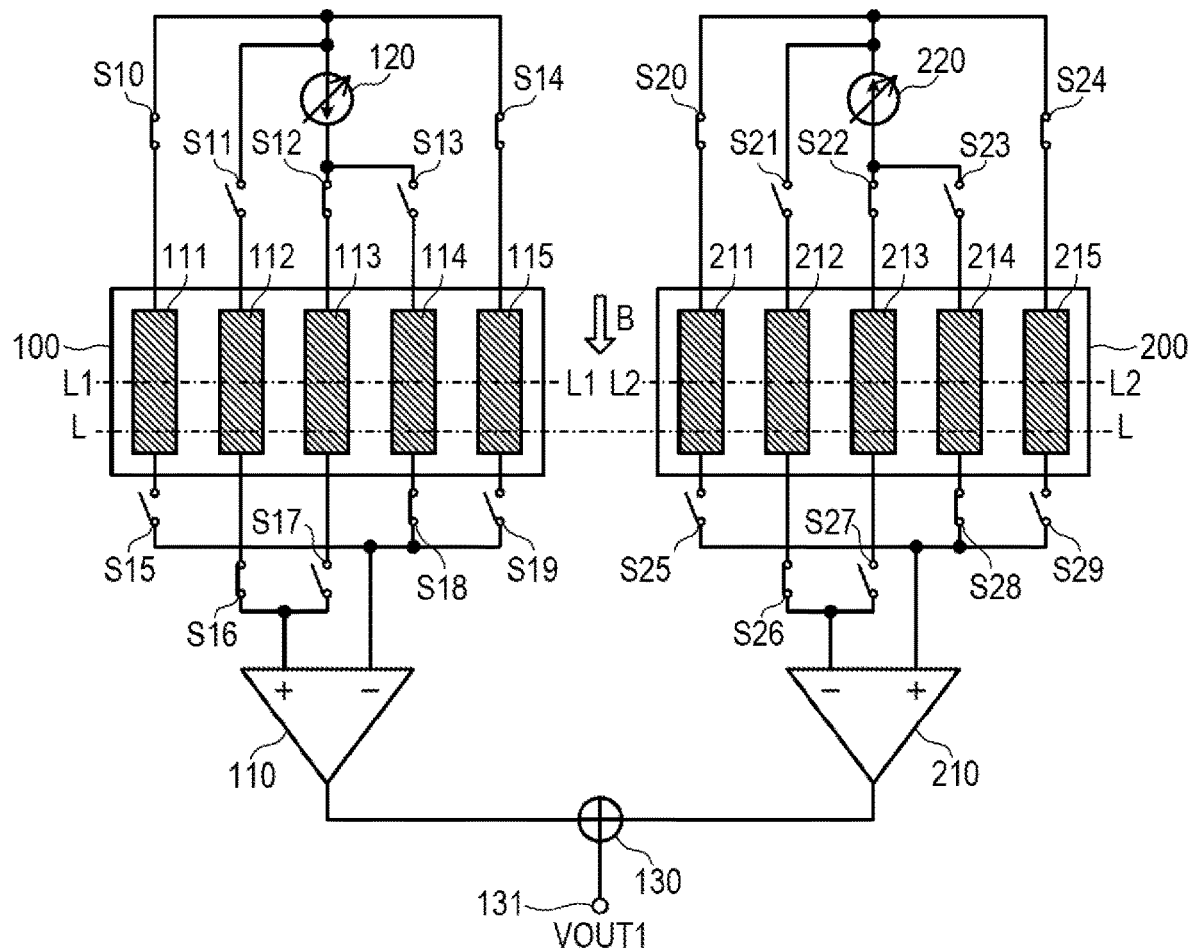
FIG. 1 is a schematic diagram for illustrating a semiconductor device including vertical Hall elements according to an embodiment of the present invention.
Figure 2:
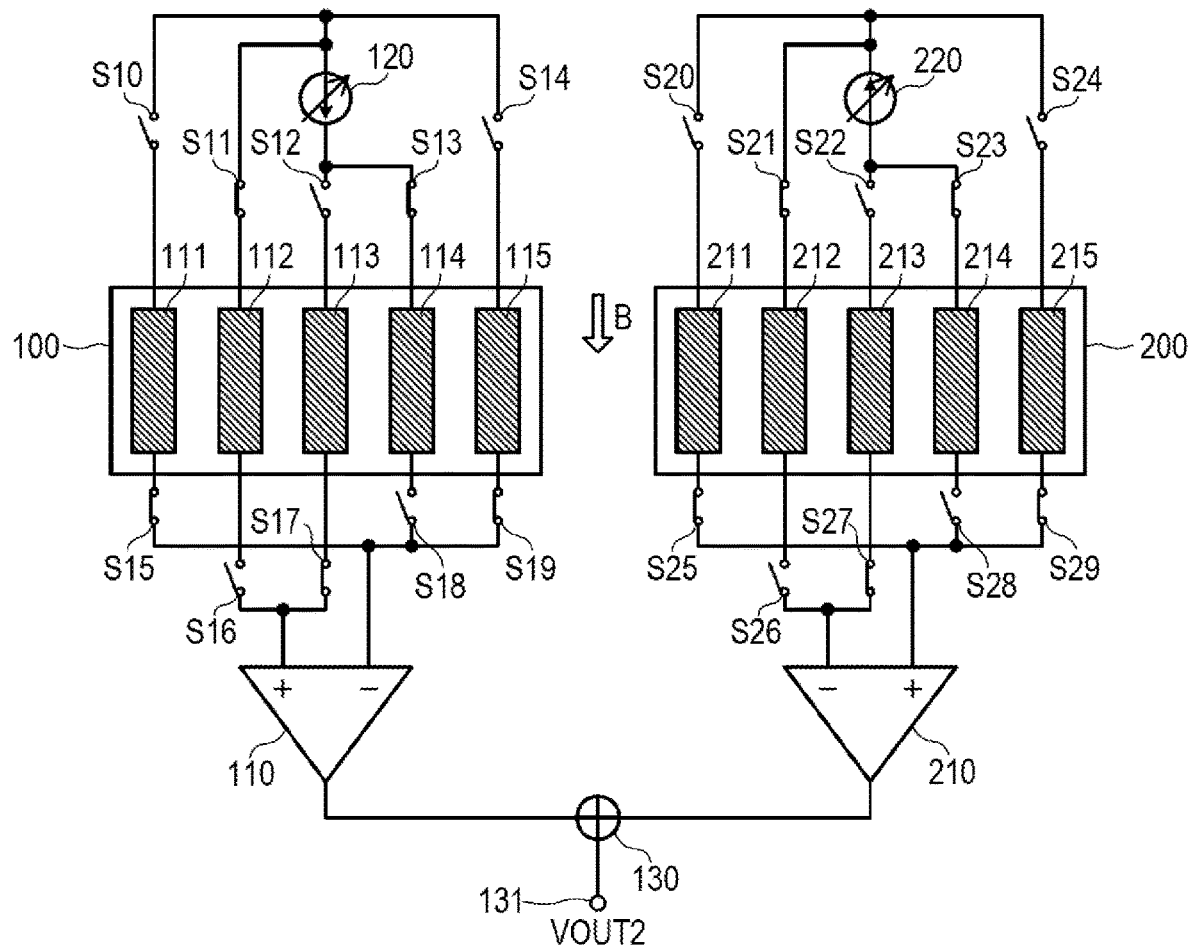
FIG. 2 is a schematic diagram for illustrating a semiconductor device including vertical Hall elements according to an embodiment of the present invention.

FIG. 1 and FIG. 2 are schematic diagrams for illustrating a semiconductor device including vertical Hall elements according to an embodiment of the present invention. In FIG. 1, a first case (phase 1) is illustrated in which a direction of a current flowing through each of the vertical Hall elements is set to be in a first condition at the execution of the spinning current method. In FIG. 2, a second case (phase 2) is illustrated in which a direction of the current flowing through each of the vertical Hall elements is set to be in a second condition at the execution of the spinning current method.

As illustrated in FIG. 1 and FIG. 2, the semiconductor device according to the embodiment includes a vertical Hall element 100 and a vertical Hall element 200; a current source 120 and a current source 220 serving as drive power sources configured to supply drive currents to the vertical Hall elements 100 and 200, respectively; an amplifier 110 and an amplifier 210 configured to amplify signals obtained from the vertical Hall elements 100 and 200, respectively; and switches S10 to S19 and S20 to S29 configured to switch directions of the currents for driving the vertical Hall elements 100 and 200, respectively.

The vertical Hall elements 100 and 200 include five electrodes 111 to 115 and five electrodes 211 to 215 which are arranged at predetermined intervals on a straight line L1-L1 and a straight line L2-L2 illustrated in FIG. 1, respectively, and have substantially the same structure. Further, the vertical Hall elements 100 and 200 are arranged such that the straight line L1-L1 and the straight line L2-L2 are parallel to each other.

The current source 120 is configured to connect to the vertical Hall element 100 through the switches S10 to S14. That is, an input terminal of the current source 120 is connected to the electrode 111 through the switch S10, to the electrode 112 through the switch S11, and to the electrode 115 through the switch S14, and an output terminal of the current source 120 is connected to the electrode 113 through the switch S12 and to the electrode 114 through the switch S13.

Meanwhile, the current source 220 is configured to connect to the vertical Hall element 200 through the switches S20 to S24. That is, an input terminal of the current source 220 is connected to the electrode 213 through the switch S22 and to the electrode 214 through the switch S23, and an output terminal of the current source 220 is connected to the electrode 211 through the switch S20, to the electrode 212 through the switch S21, and to the electrode 215 through the switch S24.

Further, the amplifier 110 is configured to connect to the vertical Hall element 100 through the switches S15 to S19. That is, a non-inverting input terminal of the amplifier 110 is connected to the electrode 112 through the switch S16 and to the electrode 113 through the switch S17, and an inverting input terminal of the amplifier 110 is connected to the electrode 111 through the switch S15, to the electrode 114 through the switch S18, and to the electrode 115 through the switch S19.

Meanwhile, the amplifier 210 is configured to connect to the vertical Hall element 200 through the switches S25 to S29. That is, a non-inverting input terminal of the amplifier 210 is connected to the electrode 211 through the switch S25, to the electrode 214 through the switch S28, and to the electrode 215 through the switch S29, and an inverting input terminal of the amplifier 210 is connected to the electrode 212 through the switch S26 and to the electrode 213 through the switch S27.

Figure 3:
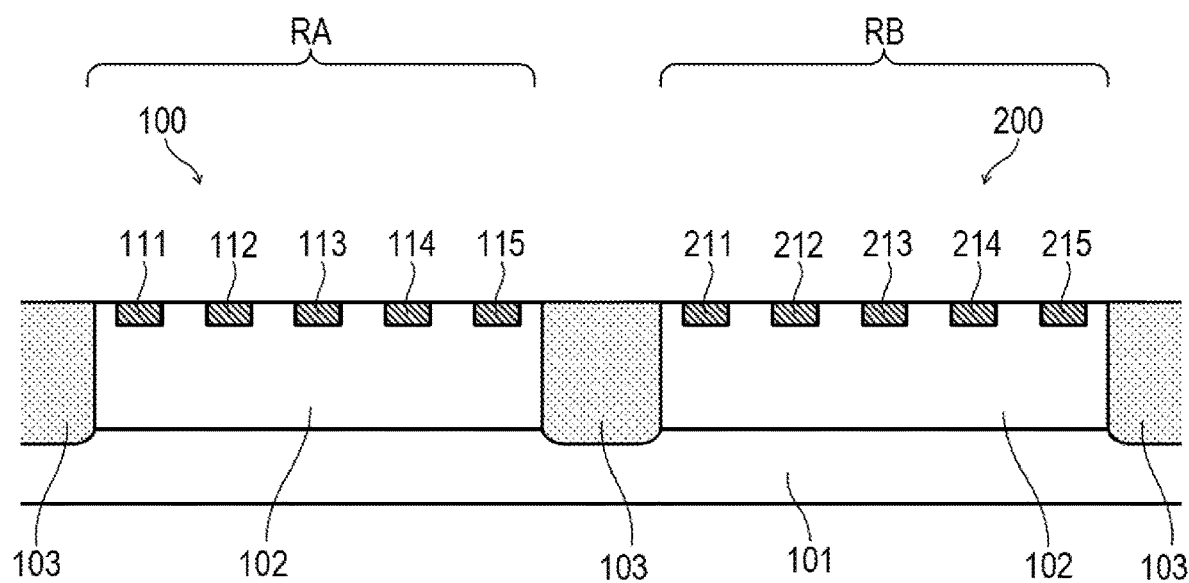
FIG. 3 is a sectional view for illustrating an example of the structure of the vertical Hall elements in the embodiment of the present invention, and is a view corresponding to a cross section taken along the line L-L of the semiconductor device illustrated in FIG. 1.

The vertical Hall element 100 and the vertical Hall element 200 are simultaneously formed on the same semiconductor substrate by the semiconductor manufacturing process. Now, an example of the structure of each of the vertical Hall elements 100 and 200 is described with reference to FIG. 3. FIG. 3 is a view corresponding to a cross section taken along the line L-L of the semiconductor device illustrated in FIG. 1.

As illustrated in FIG. 3, the vertical Hall elements 100 and 200 are formed in a region RA and a region RB of a P-type (first conductivity type) semiconductor substrate 101, respectively. The region RA and the region RB are electrically separated from each other by a P-type element isolation diffusion layer 103 formed in an N-type (second conductivity type) semiconductor layer 102 provided on the semiconductor substrate 101. The electrodes 111 to 115 of the vertical Hall element 100 and the electrodes 211 to 215 of the vertical Hall element 200 are formed by N-type impurity regions each having a higher concentration than that of the semiconductor layer 102 and being provided adjacent to a surface of the semiconductor layer 102 in each the regions RA and RB.

Although not shown in FIG. 3, the current sources 120 and 220, the amplifiers 110 and 210, and the switches S10 to S19 and S20 to S29 illustrated in FIG. 1 and FIG. 2 are also formed to electrically separate from the vertical Hall elements 100 and 200 by the element isolation diffusion layers 103 on regions other than the regions RA and RB of the semiconductor substrate 101.

In FIG. 3, an example is illustrated in which the vertical Hall element 100 and the vertical Hall element 200 are arranged side by side in a lateral direction, that is, arranged such that the straight line L1-L1 and the straight line L2-L2 illustrated in FIG. 1 are on the same straight line. However, the present invention is not limited thereto. The vertical Hall element 100 and the vertical Hall element 200 may be arranged in any positions as long as the straight line L1-L1 and the straight line L2-L2 are arranged in parallel. For example, the vertical Hall element 100 and the vertical Hall element 200 may be arranged in parallel in a vertical direction, that is, in FIG. 1 and FIG. 2, the vertical Hall element 100 may be arranged on an upper side of the drawing sheet and the vertical Hall element 200 may be arranged on a lower side of the drawing sheet are arranged. Further, arrangement of the vertical Hall element 100 and the vertical Hall element 200 adjacent to each other is not necessarily required. For example, the current sources 120 and 220 or the amplifiers 110 and 210 can also be arranged between the vertical Hall element 100 and the vertical Hall element 200.

Next, a description is given of a method of performing offset cancellation by the spinning current method through use of the vertical Hall elements 100 and 200 of the semiconductor device according to the embodiment. The magnetic field is applied in a direction indicated by an arrow B illustrated in FIG. 1 and FIG. 2.

First, as illustrated in FIG. 1, in the phase 1, the switches S10, S12, S14, S16, and S18 connected to the vertical Hall element 100 and the switches S20, S22, S24, S26, and S28 connected to the vertical Hall element 200 are turned on, and the switches S11, S13, S15, S17, and S19 connected to the vertical Hall element 100 and the switches S21, S23, S25, S27, and S29 connected to the vertical Hall element 200 are turned off.

In the above connection, the drive current is supplied from the current source 120 to the vertical Hall element 100 such that the current flows from the electrode 113 to the electrodes 111 and 115 at both ends (direction of the current at this time is referred to as "first current direction"), and a potential difference is generated between the electrode 112 and the electrode 114. The switches S16 and S18 are on, the non-inverting input terminal of the amplifier 110 is connected to the electrode 112, and the inverting input terminal is connected to the electrode 114. The amplifier 110 therefore amplifies the potential difference between the electrode 112 and the electrode 114 to output the amplified potential difference to an adder 130.

The drive current is supplied from the current source 220 to the vertical Hall element 200 such that the current flows from the electrodes 211 and 215 at both ends to the electrode 213 (direction of the current at this time is referred to as "second current direction"), and a potential difference is generated between the electrode 212 and the electrode 214. The switches S26 and S28 are on, the non-inverting input terminal of the amplifier 210 is connected to the electrode 214, and the inverting input terminal is connected to the electrode 212. The amplifier 210 therefore amplifies the potential difference between the electrode 214 and the electrode 212 to output the amplified potential difference to the adder 130.

The adder 130 adds the output signal from the amplifier 110 to the output signal from the amplifier 210, and provides an output voltage VOUT1 to an output terminal 131 as an output voltage of the phase 1. The output voltage VOUT1 is held by, for example, a sample-and-hold circuit (not shown).

Next, as illustrated in FIG. 2, in the phase 2, the switches S11, S13, S15, S17, and S19 connected to the vertical Hall element 100 and the switches S21, S23, S25, S27 and S29 connected to the vertical Hall element 200 are turned on, and the switches S10, S12, S14, S16, and S18 connected to the vertical Hall element 100 and the switches S20, S22, S24, S26, and S28 connected to the vertical Hall element 200 are turned off.

In the above connection, the drive current is supplied from the current source 120 to the vertical Hall element 100 such that the current flows from the electrode 114 to the electrode 112 (direction of the current at this time is referred to as "third current direction"), and a potential difference is generated between the electrode 113 and the electrodes 111 and 115. The switches S15, S17, and S19 are turned on, the non-inverting input terminal of the amplifier 110 is connected to the electrode 113, and the inverting input terminal is connected to the electrodes 111 and 115. The amplifier 110 therefore amplifies the potential difference between the electrode 113 and the electrodes 111 and 115 to output the amplified potential difference to the adder 130.

The drive current is supplied from the current source 220 to the vertical Hall element 200 such that the current flows from the electrode 212 to the electrode 214 (direction of the current at this time is referred to as "fourth current direction"), and a potential difference is generated between the electrodes 211 and 215 and the electrode 213. The switches S25, S27, and S29 are on, the non-inverting input terminal of the amplifier 210 is connected to the electrodes 211 and 215, and the inverting input terminal is connected to the electrode 213. The amplifier 210 therefore amplifies the potential difference between the electrodes 211, 215 and the electrode 213 to output the amplified potential difference to the adder 130.

The adder 130 adds the output signal from the amplifier 110 to the output signal from the amplifier 210, and provides an output voltage VOUT2 to the output terminal 131 as an output voltage of the phase 2.

Then, the output voltage VOUT1 obtained in the phase 1 is subtracted from the output voltage VOUT2 obtained in the phase 2, thereby permitting attainment of the final output voltage from which the offset voltage is removed.

In the above description, the example is illustrated in which the drive current in the first current direction is supplied to the vertical Hall element 100 and the drive current in the second current direction is supplied to the vertical Hall element 200 in the phase 1, and the drive current in the third current direction is supplied to the vertical Hall element 100 and the drive current in the fourth current direction is supplied to the vertical Hall element 200 in the phase 2. However, the supply directions of the drive currents are not limited thereto. A switching method for the switches may be changed in the following manner, for example, in which the drive current in the first current direction may be supplied to the vertical Hall element 100 and the drive current in the fourth current direction may be supplied to the vertical Hall element 200 in the phase 1, and the drive current in the third current direction may be supplied to the vertical Hall element 100 and the drive current in the second current direction may be supplied to the vertical Hall element 200 in the phase 2. The supply directions of the drive currents are appropriately changeable, and the offset voltage may be canceled by appropriately adding or subtracting the output voltage obtained accordingly.

The vertical Hall element 100 and the vertical Hall element 200 are simultaneously formed on the same semiconductor substrate in the semiconductor manufacturing process. However, realizing totally the same impurity concentration distribution or the like in the vertical Hall elements 100 and 200 is difficult. Variations in the characteristics are therefore generated between the vertical Hall element 100 and the vertical Hall element 200.

In the embodiment, the current source 120 and the current source 220, which are separately provided, drive the vertical Hall element 100 and the vertical Hall element 200, respectively. In this configuration, the drive current of the vertical Hall element 100 and the drive current of the vertical Hall element 200 can be separately adjusted.

That is, the current from the current source 120 and the current from the current source 220 are set in advance to have the same current value (referred to as initial current value), and output voltages of the vertical Hall element 100 and the vertical Hall element 200 are measured in supply of the drive current having the same direction and the same current value to each of the vertical Hall element 100 and the vertical Hall element 200. Then, based on a difference between the measured output voltages, the current values of the current source 120 and the current value of the current source 220 are adjusted so that the difference vanishes. In this manner, variation in the characteristics between the vertical Hall element 100 and the vertical Hall element 200 can be substantially compensated. Offset cancellation by the spinning current method can therefore be performed with high accuracy. It is preferred that each current value of the current source 120 and the current source 220 is adjusted by, for example, increasing the current value of the current source 120 by α from the initial current value and decreasing the current value of the current source 220 by α from the initial current value such that the total current value (drive current) is constant. In this manner, it is possible to eliminate the need to adjust the circuits such as the amplifiers 110 and 210 on output sides of the vertical Hall elements 100 and 200.

Further, the embodiment has the configuration in which the outputs of the vertical Hall elements 100 and 200 are amplified by the separate amplifiers 110 and 210, respectively. With this configuration, it is also possible to compensate variation in the characteristics between the vertical Hall element 100 and the vertical Hall element 200 by adjusting respective gains of the amplifiers 110 and 210.

Meanwhile, though not shown, the output sides of the vertical Hall elements 100 and 200 may be appropriately connected, and an output voltage from the vertical Hall elements 100 and 200 may be amplified by a single amplifier. In this case, variation in the characteristics between the vertical Hall element 100 and the vertical Hall element 200 cannot be compensated by adjusting the gains of the two amplifiers 110 and 210 as described above, but the circuit can be downsized because of the single amplifier.

Further, according to the embodiment, based on a condition for detection of the magnetic field, a hysteresis characteristic can be added to the final output voltage by appropriately adjusting the drive currents supplied to the respective vertical Hall elements 100 and 200, that is, the current values of the current sources 120 and 220. A specific configuration example is described below with reference to FIG. 4 in which the current values of the current sources 120 and 220 are adjusted so as to add a hysteresis characteristic to the final output voltage.

Figure 4:
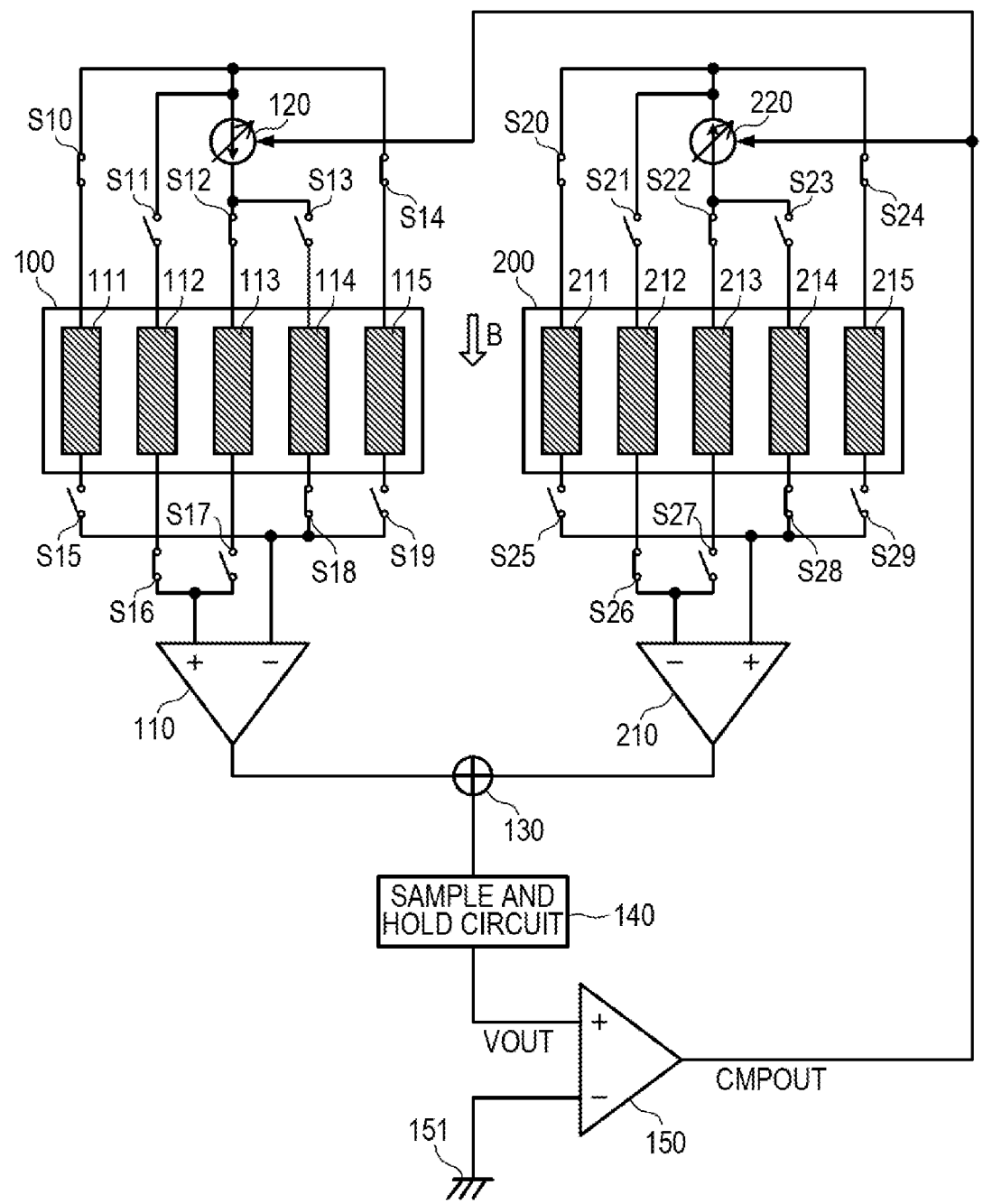
FIG. 4 is a schematic diagram for illustrating a specific configuration example in which a hysteresis characteristic is added to the semiconductor device illustrated in FIG. 1.
Figure 5:
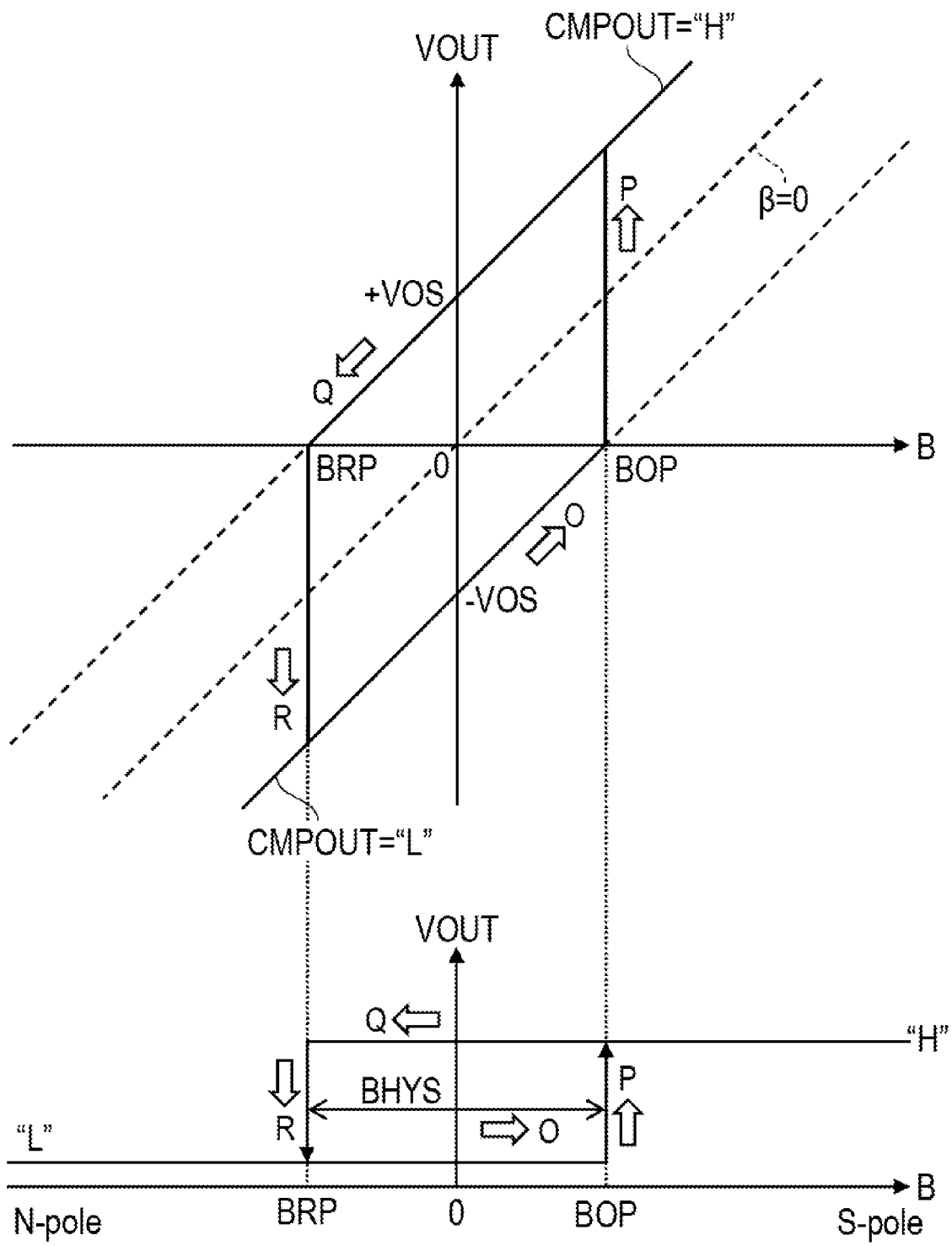
FIG. 5 is a graph for showing a magnetoelectric conversion characteristic of the semiconductor device illustrated in FIG. 4.
Figure 6:
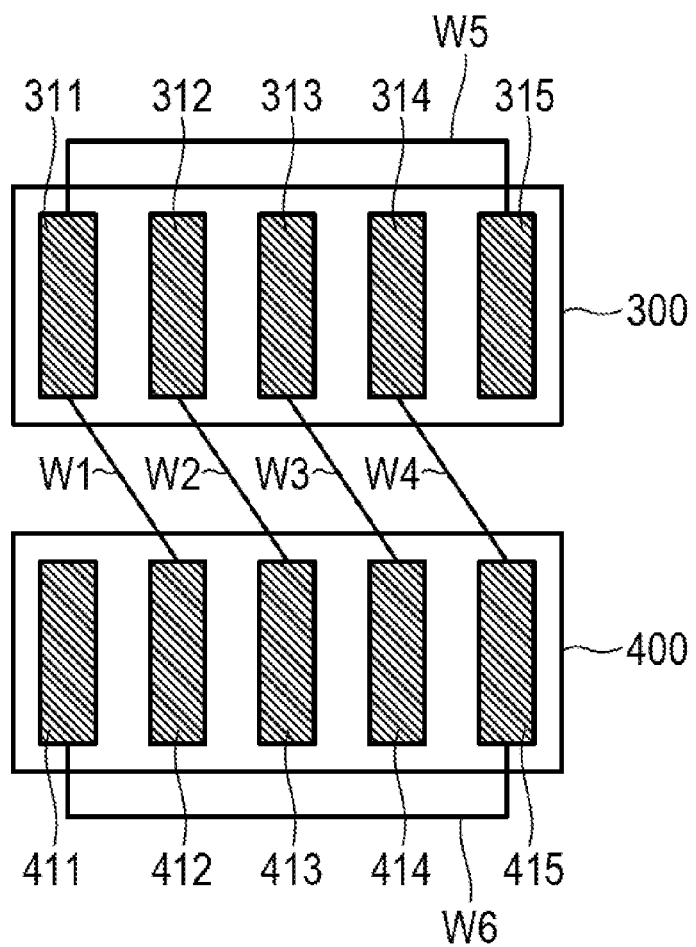
FIG. 6 is a schematic diagram for illustrating a semiconductor device having Hall elements in prior art.

FIG. 4 is a diagram for illustrating the specific configuration example in which a hysteresis characteristic is added to the final output voltage of the semiconductor device illustrated in FIG. 1 and FIG. 2. In FIG. 4, the same condition of the phase 1 as that in FIG. 1 is illustrated, while the condition of the phase 2 is the same as that in FIG. 2, and hence illustration thereof is omitted. Further, FIG. 5 is a graph for showing magnetoelectric conversion characteristic of the semiconductor device illustrated in FIG. 4.

The semiconductor device illustrated in FIG. 4 further includes, in addition to the configuration of the semiconductor device illustrated in FIG. 1, a sample-and-hold circuit 140 and a comparator 150.

The sample-and-hold circuit 140 holds the output voltage VOUT1 in the phase 1 described above, further subtracts the output voltage VOUT1 temporally held in the circuit from the output voltage VOUT2 in the phase 2, and provides the subtraction result as the final output voltage VOUT.

The output voltage VOUT from the sample-and-hold circuit 140 is supplied to a non-inverting input terminal of the comparator 150, a ground voltage from a ground terminal 151 is supplied to an inverting input terminal of the comparator 150 as a reference voltage, and a result of comparison between the voltage VOUT and the ground voltage is provided as an output signal CMPOUT. The output signal CMPOUT from the comparator 150 is supplied to the current sources 120 and 220.

As described above, the current values of the current sources 120 and 220 are adjusted in advance in order to compensate variation in the characteristics between the vertical Hall element 100 and the vertical Hall element 200. The current sources 120 and 220 are each configured to, based on the output signal CMPOUT from the comparator 150, switch the current value between two values with reference to the current value in the adjusted condition.

The ground voltage (0 V) is supplied to the inverting input terminal of the comparator 150, and hence the comparator 150 provides the output signal CMPOUT corresponding to the voltage value of the voltage VOUT of the non-inverting input terminal as follows:

when VOUT>0, CMPOUT="H", and
when VOUT<0, CMPOUT="L".

Next, an operation in the embodiment is described with reference to FIG. 5. In FIG. 5 the X-axis represents an applied magnetic flux density B, and the Y-axis represents the output voltage VOUT from the sample-and-hold circuit 140 (input voltage of the non-inverting input terminal of the comparator 150).

Suppose that the current values of the current sources 120 and 220 before the adjustment are both I and the current values of the current sources 120 and 220 after adjustment are I1 and I2, respectively, and that $\alpha$ and $\beta$ are constants, then the current values I1 and I2 can be defined as follows:

when CMPOUT="H", $I1=I(1+\alpha+\beta)$ and $I2=I(1-\alpha-\beta)$, and when CMPOUT="L", $I1=I(1+\alpha-\beta)$ and $I2=I(1-\alpha+\beta)$.

By switching the current values of the current sources 120 and 220 between two values based on the output signal CMPOUT of the comparator 150, the output voltage VOUT of the sample-and-hold circuit 140 can thus have magnetoelectric conversion characteristic composed from two lines which incline equally and whose Y-intercepts are each offset from the origin by ±VOS.

The constant $\alpha$ is a value adjusted in advance so as to compensate variation in the characteristics between the vertical Hall element 100 and the vertical Hall element 200. A straight line corresponding to $\beta=0$ represents the magnetoelectric conversion characteristic in which variation in the characteristics is compensated by adding or subtracting $\alpha$ described above to obtain the current value I1 of the current source 120 and the current value I2 of the current source 220. The value of $\beta$ is set arbitrary depending on a desired hysteresis width BHYS.

When the applied magnetic flux density B increases from zero in a positive direction (S-pole), the output voltage VOUT of the sample-and-hold circuit 140 increases along a straight line corresponding to CMPOUT="L" (corresponding to an arrow O in FIG. 5). When VOUT>0, the output signal CMPOUT of the comparator 150 transitions from "L" to "H" and the magnetoelectric conversion characteristic with respect to the applied magnetic flux density B is switched to a straight line corresponding to CMPOUT="H" (corresponding to an arrow P in FIG. 5). The applied magnetic flux density B at this moment is an operating point BOP.

Next, when the applied magnetic flux density B increases in a negative direction (N-pole), the output voltage VOUT of the sample-and-hold circuit 140 decreases along a straight line corresponding to CMPOUT="H" (corresponding to an arrow Q in FIG. 5). When VOUT<0, the output signal CMPOUT of the comparator 150 transitions from "H" to "L" and the magnetoelectric conversion characteristic with respect to the applied magnetic flux density B is switched again to a straight line corresponding to CMPOUT="L" (corresponding to an arrow R in FIG. 5). The applied magnetic flux density B at this moment is a returning point BRP.

Thus, providing the magnetoelectric conversion characteristics with the hysteresis characteristic can achieve an alternating detection characteristic having the hysteresis width BHYS. Since it is not required to provide a circuit or the like usually provided to add a hysteresis characteristic at a subsequent stage of the output of the sample-and-hold circuit 140 so as to switch signal transmission polarities of a signal path, and since it is only required to add a comparator having a simple configuration, hence an occupation area by the circuit can be reduced.

A predetermined reference voltage VREF instead of the ground voltage may be supplied to the inverting input terminal of the comparator 150. In this case, since an inversion level of the magnetoelectric conversion characteristics of the output voltage VOUT of the sample-and-hold circuit 140 of FIG. 5 is not 0 but VREF, the relation between the output voltage VOUT and the output signal CMPOUT becomes as follows:

when VOUT>VREF, CMPOUT="H", and
when VOUT<VREF, CMPOUT="L".

The operating point BOP and the returning point BRP offset in accordance with the absolute value and the polarity of the predetermined reference voltage VREF. That is, VREF (>0) is supplied such that the operating point BOP and the returning point BRP are both positive, then an S-pole detection characteristic having the operating point BOP and the returning point BRP on the S-pole side can be achieved. Further, VREF (<0) is supplied such that the operating point BOP and the returning point BRP are both negative, then an N-pole detection characteristic having the operating point BOP and the returning point BRP on the N-pole side can be also achieved.

In FIG. 4, the example is illustrated in which the current values of both the current sources 120 and 220 are switched based on the output signal CMPOUT of the comparator 150. However, a configuration in which only one current value of the current source 120 or 220 is switched may be adopted.

As described above, according to the embodiment, the current source 220 for driving the vertical Hall element 200 is provided separately from the current source 120 for driving the vertical Hall element 100. Thus, characteristic errors in the vertical Hall element 100 and the vertical Hall element 200 generated in a semiconductor manufacturing process can be compensated by appropriately adjusting the current values of the current source 120 and the current source 220. The spinning current method can be performed under a condition in which the characteristic of the vertical Hall element 100 and the characteristic of the vertical Hall element 200 are set to be substantially the same. Offset cancellation can therefore be performed with high accuracy. Further, the final output voltage VOUT can be added with a hysteresis characteristic by controlling to switch the current values of the current source 120 and the current source 220 based on the output signal CMPOUT of the comparator 150. Since addition of a special circuit which is usually provided at a subsequent stage of the final output voltage VOUT so as to add a hysteresis characteristic is not required, hence the area of the entire semiconductor device can be reduced.

It is apparent that the present invention is not limited to the above embodiments and may be modified and changed without departing from the scope and spirit of the invention.

For example, in the embodiment described above, the example using the current sources as driving power sources has been described, but voltage sources may be used instead of the current sources. In this case, the drive currents of the vertical Hall elements are adjusted by adjusting voltage values of the voltage sources.

In the embodiment described above, the semiconductor device including two vertical Hall elements has been described as an example, but the present invention is also applicable to a semiconductor device including three or more vertical Hall elements. In this case, as in the embodiment described above, the characteristic errors of the plurality of vertical Hall elements generated in the semiconductor manufacturing process can be corrected by providing the same number of drive power sources as the number of the plurality of vertical Hall elements and by driving each vertical Hall element by an independent drive power source. In particular, in a configuration including four vertical Hall elements, drive currents in the first to fourth current directions can be supplied to each vertical Hall element all at once, and hence time needed for offset cancellation can be shortened. In addition, in a configuration including eight vertical Hall elements, drive currents in the four directions can be supplied to each of two vertical Hall elements, and hence more accurate offset cancellation can be achieved.

In the embodiment described above, the example has been described in which the amplifier 110 and the amplifier 210 are connected to the vertical Hall element 100 and the vertical Hall element 200, respectively, and the output signal of the amplifier 110 and the output signal of the amplifier 210 are added by the adder 130. However, the following configuration is also applicable. That is, a single amplifier is provided. First of all, under the condition illustrated in FIG. 1, a difference between the output voltages obtained by driving the vertical Hall element 100 is amplified by the single amplifier to have the first output signal, and, under the condition illustrated in FIG. 1, a difference between the output voltages obtained by driving the vertical Hall element 200 is amplified by the single amplifier to have the second output signal. Then, under the condition illustrated in FIG. 2, a difference between the output voltages obtained by driving the vertical Hall element 100 is amplified by the single amplifier to have the third output signal, and finally, under the condition illustrated in FIG. 2, a difference between the output voltages obtained by driving the vertical Hall element 200 is amplified by the single amplifier to have the fourth output signal. The first to fourth output signals are added or subtracted. Thus, only one amplifier is needed, and hence a circuit can be downsized. Since time-division processing is used, the time needed for offset cancellation extends. When high speed processing is needed, it is therefore preferred to provide plural amplifiers corresponding to respective vertical Hall elements as in the embodiment described above.

In the embodiment described above, the current directions of the currents supplied to the vertical Hall elements 100 and 200 are two directions. That is, the vertical Hall element 100 is supplied with the drive currents in the first and third current directions, and the vertical Hall element 200 is supplied with the drive currents in the second and fourth current directions. However, each of the vertical Hall elements 100 and 200 may be applied with the currents in the first to fourth current directions to perform offset cancellation. In this case, four phases are required, and hence the time needed for offset cancellation is increased, but the accuracy of offset cancellation can be improved.

In the embodiment described above, the example has been described in which the vertical Hall elements 100 and 200 each have five electrodes, but the present invention is not limited thereto. As long as the vertical Hall element 100 has the same number of electrodes as that of the vertical Hall element 200, each element may have three or more electrodes. This also applies to a case in which the semiconductor device includes three or more vertical Hall elements.

In the embodiment described above, the first conductivity type is described as a P-type, and the second conductivity type is described as an N-type. However, the conductivity types may be changed, that is, the first conductivity type may be an N-type, and the second conductivity type may be a P-type.

What is claimed is:

1. A semiconductor device, comprising:
a first vertical Hall element in a first region of a semiconductor substrate, and including a first plurality of electrodes at predetermined intervals on a first straight line;
a second vertical Hall element in a second region of the semiconductor substrate different from the first region, and including a second plurality of electrodes equal in number to the first plurality of electrodes, the second plurality of electrodes at the predetermined intervals on a second straight line parallel to the first straight line;
a first drive power source configured to drive the first vertical Hall element;
a second drive power source, separate from the first drive power source, and configured to drive the second vertical Hall element; and
first switches respectively connecting the first and second drive power sources to alternating ones of the first and second plurality of electrodes, and second switches respectively connecting outputs of the alternating ones of the first and second plurality of electrodes.

2. The semiconductor device according to claim 1, wherein the first drive power source and the second drive power source are current sources.

3. The semiconductor device according to claim 1, wherein the first drive power source and the second drive power source are voltage sources.

4. The semiconductor device according to claim 1, wherein the first vertical Hall element and the second vertical Hall element have substantially the same structure.

5. The semiconductor device according to claim 1, further comprising:
a first amplifier configured to amplify an output voltage from the first vertical Hall element;
a second amplifier, separate from the first amplifier, and configured to amplify an output voltage from the second vertical Hall element; and
an adder configured to add an output signal from the first amplifier and an output signal from the second amplifier.

6. The semiconductor device according to claim 2, further comprising:
a first amplifier configured to amplify an output voltage from the first vertical Hall element;
a second amplifier, separate from the first amplifier, and configured to amplify an output voltage from the second vertical Hall element; and
an adder configured to add an output signal from the first amplifier and an output signal from the second amplifier.

7. The semiconductor device according to claim 3, further comprising:
a first amplifier configured to amplify an output voltage from the first vertical Hall element;
a second amplifier, separate from the first amplifier, and configured to amplify an output voltage from the second vertical Hall element; and
an adder configured to add an output signal from the first amplifier and an output signal from the second amplifier.

8. The semiconductor device according to claim 4, further comprising:
a first amplifier configured to amplify an output voltage from the first vertical Hall element;
a second amplifier, separate from the first amplifier, and configured to amplify an output voltage from the second vertical Hall element; and
an adder configured to add an output signal from the first amplifier and an output signal from the second amplifier.

9. The semiconductor device according to claim 5, further comprising a sample-and-hold circuit configured to:
hold a first output voltage from the adder at a first condition to which respective directions of currents from the first drive power source and the second drive power source flowing to the first vertical Hall element and the second vertical Hall element are set;
perform one of an addition of a second output voltage to the first output voltage and a subtraction of the first output voltage from the second output voltage from the adder at a second condition to which respective directions of currents from the first drive power source and the second drive power source flowing to the first vertical Hall element and the second vertical Hall element are set; and
provide a result of one of the addition and the subtraction as a final output voltage.

10. The semiconductor device according to claim 6, further comprising a sample-and-hold circuit configured to:
hold a first output voltage provided from the adder at a first condition to which respective directions of currents from the first drive power source and the second drive power source flowing to the first vertical Hall element and the second vertical Hall element are set;
perform one of an addition of a second output voltage to the first output voltage and a subtraction of the first output voltage from the second output voltage from the adder at a second condition to which respective directions of currents from the first drive power source and the second drive power source flowing to the first vertical Hall element and the second vertical Hall element are set; and
provide a result of one of the addition and the subtraction as a final output voltage.

11. The semiconductor device according to claim 7, further comprising a sample-and-hold circuit configured to:
hold a first output voltage provided from the adder at a first condition to which respective directions of currents from the first drive power source and the second drive power source flowing to the first vertical Hall element and the second vertical Hall element are set;
perform one of an addition of a second output voltage to the first output voltage and a subtraction of the first output voltage from the second output voltage from the adder at a second condition to which respective directions of currents from the first drive power source and the second drive power source flowing to the first vertical Hall element and the second vertical Hall element are set; and
provide a result of one of the addition and the subtraction as a final output voltage.

12. The semiconductor device according to claim 8, further comprising a sample-and-hold circuit configured to:
hold a first output voltage provided from the adder at a first condition to which respective directions of currents from the first drive power source and the second drive power source flowing to the first vertical Hall element and the second vertical Hall element are set;
perform one of an addition of a second output voltage to the first output voltage and a subtraction of the first output voltage from the second output voltage from the adder at a second condition to which respective directions of currents from the first drive power source and the second drive power source flowing to the first vertical Hall element and the second vertical Hall element are set; and provide a result of one of the addition and the subtraction as a final output voltage.

13. The semiconductor device according to claim 9, further comprising a comparator configured to receive the final output voltage through an input terminal, receive a predetermined reference voltage through another input terminal, and output a result of comparison between the final output voltage and the predetermined reference voltage as an output signal, wherein at least one of the first drive power source and the second drive power source is configured to switch one of a current value and a voltage value thereof depending on the output signal from the comparator.

14. The semiconductor device according to claim 10, further comprising a comparator configured to receive the final output voltage through an input terminal, receive a predetermined reference voltage through another input terminal, and output a result of comparison between the final output voltage and the predetermined reference voltage as an output signal, wherein at least one of the first drive power source and the second drive power source is configured to switch one of a current value and a voltage value thereof depending on the output signal from the comparator.

15. The semiconductor device according to claim 11, further comprising a comparator configured to receive the final output voltage through an input terminal, receive a predetermined reference voltage through another input terminal, and output a result of comparison between the final output voltage and the predetermined reference voltage as an output signal, wherein at least one of the first drive power source and the second drive power source is configured to switch one of a current value and a voltage value thereof depending on the output signal from the comparator.

16. The semiconductor device according to claim 12, further comprising a comparator configured to receive the final output voltage through an input terminal, receive a predetermined reference voltage through another input terminal, and output a result of comparison between the final output voltage and the predetermined reference voltage as an output signal, wherein at least one of the first drive power source and the second drive power source is configured to switch one of a current value and a voltage value thereof depending on the output signal from the comparator.

17. A method of adjusting the semiconductor device of claim 1, the method comprising:

setting an initial value of one of a current value and a voltage value of the first drive power source and an initial value of one of a current value and a voltage value of the second drive power source to be the same and measuring output voltages from the first vertical Hall element and the second vertical Hall element in supply of a drive current having the same direction and the same amount to each of the first vertical Hall element and the second vertical Hall element; and adjusting, based on a difference between the output voltages, the one of the current value and the voltage value of the first drive power source to increase the one of the current value and the voltage value by a predetermined constant value a from the initial value, and adjusting the one of the current value and the voltage value of the second drive power source to decrease the one of the current value and the voltage value by the predetermined constant value $\alpha$ from the initial value, to thereby correct the difference.

* * * * *